United States Patent [19]

Kunimatsu et al.

[11] Patent Number: 5,767,564
[45] Date of Patent: Jun. 16, 1998

[54] SEMICONDUCTOR DEVICE WITH A DECOUPLING CAPACITOR MOUNTED THEREON HAVING A THERMAL EXPANSION COEFFICIENT MATCHED TO THE DEVICE

[75] Inventors: Yasuyoshi Kunimatsu; Akira Furuzawa; Akifumi Sata, all of Kokubu, Japan

[73] Assignee: Kyocera Corporation, Kyoto, Japan

[21] Appl. No.: 678,948

[22] Filed: Jul. 12, 1996

Related U.S. Application Data

[63] Continuation of Ser. No. 326,175, Oct. 19, 1994, abandoned.

[30] Foreign Application Priority Data

| Oct. 19, 1993 | [JP] | Japan | 5-260741 |
| Dec. 28, 1993 | [JP] | Japan | 5-335562 |

[51] Int. Cl.⁶ .................................. H01L 29/00
[52] U.S. Cl. ..................... 257/532; 257/724; 257/924
[58] Field of Search ..................... 361/321.4, 321.5; 257/724, 924, 532

[56] References Cited

U.S. PATENT DOCUMENTS

| 4,475,143 | 10/1984 | Hernandez | 361/306 |
| 5,368,915 | 11/1994 | Ueda | 428/209 |
| 5,400,210 | 3/1995 | Sugimoto | 381/321.5 |

FOREIGN PATENT DOCUMENTS

| 62-43161 | 2/1987 | Japan | 257/924 |
| 62-137860 | 6/1987 | Japan | 257/924 |
| 3-254150 | 11/1991 | Japan | 257/532 |

Primary Examiner—Jerome Jackson
Assistant Examiner—Nathan K. Kelley
Attorney, Agent, or Firm—Loeb & Loeb LLP

[57] ABSTRACT

A semiconductor device having a semiconductor element mounted on an insulating substrate and a decoupling capacitor provided on the semiconductor element. The semiconductor device minimizes the occurrence of switching noise. The semiconductor device comprises an insulating substrate, a semiconductor element mounted on said insulating substrate, and a decoupling capacitor which is joined to the upper surface of said semiconductor element and is electrically connected to said semiconductor element, wherein said decoupling capacitor has a coefficient of thermal expansion close to the coefficient of thermal expansion of said semiconductor element, and is electrically connected to said semiconductor element by soldering and is further secured to said semiconductor element.

4 Claims, 2 Drawing Sheets

SEMICONDUCTOR DEVICE WITH A DECOUPLING CAPACITOR MOUNTED THEREON HAVING A THERMAL EXPANSION COEFFICIENT MATCHED TO THE DEVICE

This is a continuation of application Ser. No. 08/326,175 filed on Oct. 19, 1994, now abandoned.

BACKGROUND OF THE INVENTION

1. Field of the Invention

The present invention relates to a semiconductor device having a semiconductor element mounted on an insulating substrate and a decoupling capacitor provided on the semiconductor element. More specifically, the invention relates to a semiconductor device capable of minimizing the generation of switching noise.

2. Description of the Prior Art

In order to suppress noise caused by very high-speed switching of a logic circuit module which is highly densely integrated, in recent years, there has been used a decoupling capacitor such that the switching noise will not be coupled to a signal line through a common main power source circuit (see, for example, Japanese Patent Publication No. 70764/1992).

Such a decoupling capacitor serves as a power source that can be easily utilized for switching the semiconductor element. The decoupling capacitor is rapidly discharged to give a switching current and is charged again by an external power source. Therefore, the switching speed of the logic circuit is deeply related to the inductance of a current path between the semiconductor element and the capacitor. In order to minimize the inductance, the semiconductor element and the capacitor must be arranged close to each other, and a number of short current paths must be provided between the semiconductor element and the capacitor. As a method of accomplishing this, there has been known a semiconductor device having a decoupling capacitor disposed neighboring each of the semiconductor elements on the upper surface of the substrate.

Such a known semiconductor device can be represented by the one shown in FIG. 4. In this semiconductor device, a semiconductor element 13 is disposed on a package 11, a decoupling capacitor 15 is joined to the upper portion of the semiconductor element 13, and the decoupling capacitor 15 and the semiconductor element 13 are electrically connected together by wire bonding 14. In this semiconductor device, the inductance is decreased by the decoupling capacitor 15 to decrease the switching noise.

In the above-mentioned semiconductor device in which the decoupling capacitor 15 and the semiconductor element 13 are electrically connected together by wire bonding 14, however, the current path for connection is still long. That is, nowadays where it is required to process the data at high speeds, the above-mentioned semiconductor device still has a large inductance and produces large switching noise.

Moreover, the device is heated at a high temperature at a moment when the lower surface of the decoupling capacitor is joined to the upper surface of the semiconductor element; i.e., thermal stress builds up in the decoupling capacitor due to a difference in the coefficient of thermal expansion between the semiconductor element and the decoupling capacitor, and the decoupling capacitor is peeled off the semiconductor element.

SUMMARY OF THE INVENTION

The present inventors have forwarded the study to cope with the above-mentioned problems and have arrived at the present invention after having discovered the fact the switching noise can be minimized by electrically connecting the lower surface of the decoupling capacitor to the upper surface of the semiconductor element by soldering or the like means.

The inventors have also discovered the fact that the decoupling capacitor can be prevented from peeling off the semiconductor element in the case when the decoupling capacitor having a coefficient of thermal expansion nearly the same as that of the semiconductor element is joined to the upper surface of the semiconductor element despite the device is heated at a high temperature at the time of joining the lower surface of the decoupling capacitor to the upper surface of the semiconductor element, and have arrived at the present invention.

That is, the present invention provides a semiconductor device comprising an insulating substrate, a semiconductor element mounted on said insulating substrate, and a decoupling capacitor which is joined to the upper surface of said semiconductor element and is electrically connected to said semiconductor element, wherein said decoupling capacitor has a coefficient of thermal expansion close to the coefficient of thermal expansion of said semiconductor element, and is electrically connected to said semiconductor element by soldering and is further secured to said semiconductor element.

The present invention further provides a semiconductor device comprising an insulating substrate, a semiconductor element mounted on said insulating substrate, and a decoupling capacitor which is joined to the upper surface of said semiconductor element and is electrically connected to said semiconductor element, wherein said decoupling capacitor has a first thin electrode film composed of at least one of Al, Cr and Cu, a thin dielectric film and a second thin electrode film composed of at least one of Al, Cr and Cu that are formed in this order on the surface of a substrate made of a material having a coefficient of thermal expansion close to that of said semiconductor element.

The present invention further provides a semiconductor device comprising an insulating substrate, a semiconductor element mounted on said insulating substrate, and a decoupling capacitor which is joined to the upper surface of said semiconductor element and is electrically connected to said semiconductor element, wherein said decoupling capacitor is constituted by a dielectric ceramic and internal electrodes, and said dielectric ceramic is a perovskite-type compound containing at least Pb, Mg, Nb and Zn as metal elements and further containing Mn in an amount of from 0 to 0.6% by weight reckoned as $MnO_2$ with respect to the main components in which when the composition formula of these metal elements based upon a molar ratio is expressed as,

$Pb_{1-a}Ba_a[(Mg_{1/3}Nb_{2/3})_x(Zn_{1/3}Nb_{2/3})_y(Sm_{1/2}Nb_{1/2})_zTi_a]O_3$, x, y, z and a satisfy the following relations $0.3 \leq x \leq 0.815$, $0.159 \leq y \leq 0.70$, $0 \leq z \leq 0.040$, $0 \leq a \leq 0.116$, and $x+y+z+a=1.00$.

According to the present invention in which the decoupling capacitor is joined to the upper surface of the semiconductor element, and the semiconductor element and the decoupling capacitor are electrically connected together, the current path can be shortened compared with that of the conventional semiconductor devices in which the decoupling capacitor and the semiconductor element are connected together through wire bonding and, hence, the inductance is suppressed to a small value.

Moreover, since the decoupling capacitor is made of a material having a coefficient of thermal expansion close to that of the semiconductor element, thermal stress does not almost build up between the semiconductor element and the decoupling capacitor even when the decoupling capacitor is joined to the upper surface of the semiconductor element at a high temperature by soldering, and the decoupling capacitor does not peel off the semiconductor element.

DETAILED DESCRIPTION OF THE PREFERRED EMBODIMENTS

The invention will now be described in detail by way of the following embodiment.

Figure 1:
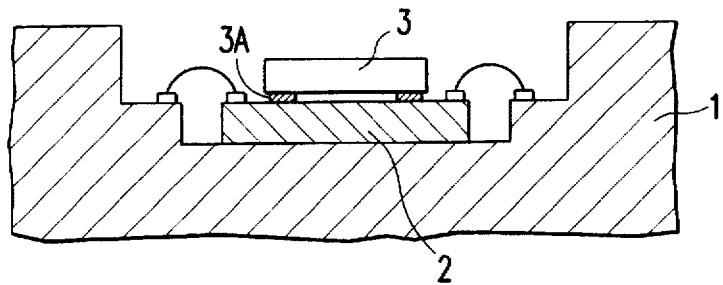
FIG. 1 is a sectional view which schematically illustrates the arrangement in a semiconductor device according to an embodiment of the present invention.

FIG. 1 illustrates a semiconductor device according to the present invention, wherein reference numeral 1 denotes a package which is an insulating substrate composed of, for example, alumina.

A semiconductor element 2 composed of silicon is disposed in the recessed portion of the package 1, and the package 1 and the semiconductor element 2 are electrically connected together by wire bonding. A decoupling capacitor 3 is joined and is secured to the upper surface of the semiconductor element 2 by an alloy 3A of solder and gold, and the upper surface of the semiconductor element 2 and the lower surface of the decoupling capacitor 3 are electrically connected together.

According to the present invention, the decoupling capacitor 3 is made of a material having a coefficient of thermal expansion close to that of the semiconductor element 2. It is desired that the decoupling capacitor is made of a material having a coefficient of thermal expansion which is within $\pm 0.8 \times 10^{-6}$/°C. with respect to the coefficient of thermal expansion of the semiconductor element.

The coefficient of thermal expansion of the decoupling capacitor can be brought into match with that of the semiconductor element by a system which uses a substrate having a coefficient of thermal expansion close to the coefficient of thermal expansion of the semiconductor element and has a thin capacitor layer laminated on the substrate, or by a system which uses a dielectric ceramic as the capacitor having a coefficient of thermal expansion close to the coefficient of thermal expansion of the semiconductor element, though the invention is in no way limited thereto only.

Figure 2:
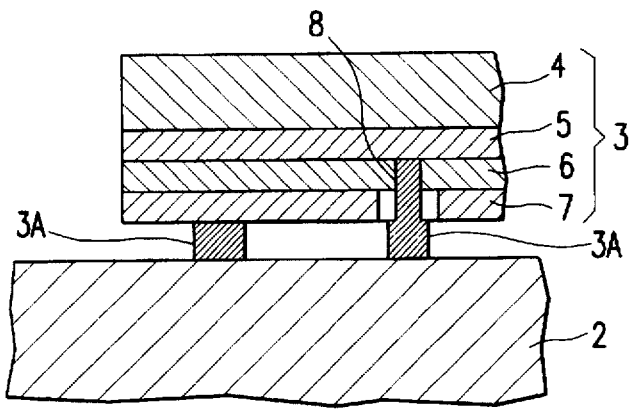
FIG. 2 is a vertical sectional view illustrating a portion of the decoupling capacitor of FIG. 1 on an enlarged scale.

With reference to FIG. 2 which illustrates the former system, the decoupling capacitor 3 is constituted by a silicon substrate 4, a first thin electrode film 5 composed of at least one of Al, Cr and Cu, a thin dielectric film 6 composed of $SiO_2$, and a second thin electrode film 7 composed of at least one of Al, Cr and Cu that are formed in the order mentioned.

The first thin electrode film is electrically connected with semiconductor through a connection conductor 8 which is not electrically connected with the second electrode film 7, and through a solder 3A.

The second thin electrode film 7 is electrically connected with semiconductor through a solder 3A.

The silicon substrate 4, thin electrode films 5, 7, and thin dielectric film 6 have sizes of from 5 to 20 mm in length, from 5 to 20 mm in width, and the silicon substrate 4 has a thickness of 0.1 mm, the thin dielectric films have a thickness of 0.1 μm and the thin dielectric film has a thickness of 0.1 μm, respectively. Moreover, the second thin electrode film 7 of the decoupling capacitor 3 and the semiconductor element 2 are electrically connected together via an alloy (gold-containing solder) 3A of solder and gold. It is urged that the decoupling capacitor 3 should have a capacitance of from 50 to 100 nF. Here, however, $SiO_2$ has a dielectric constant (εr) of about 4.0, and the thin dielectric film 6 composed of $SiO_2$ has a thickness of about 0.1 μm and a capacitance of 80 nF. Therefore, the decoupling capacitor 3 is allowed to have a sufficiently large capacitance.

The thus constituted semiconductor device is fabricated as described below. First, the semiconductor element 2 is joined to the recessed portion of the package 1, and is connected to the package 1 by wire bonding. On the other hand, the first thin electrode film 5, thin dielectric film 6 and second thin dielectric film 7 are formed in this order on the upper surface of the silicon substrate 4 by a thin film-forming device such as sputtering thereby to prepare a decoupling capacitor 3.

Figure 3:
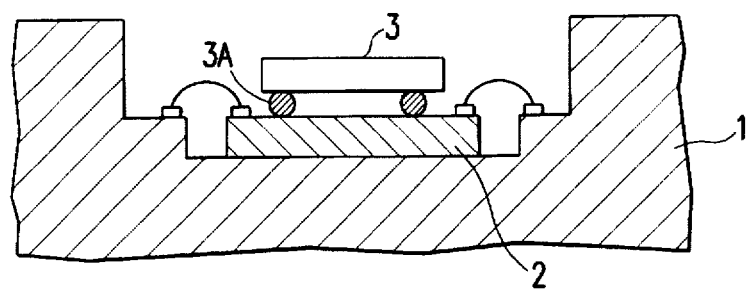
FIG. 3 is a vertical sectional view illustrating a state in which alloy balls of solder and gold are interposed between a semiconductor element and the decoupling capacitor.
Figure 4:
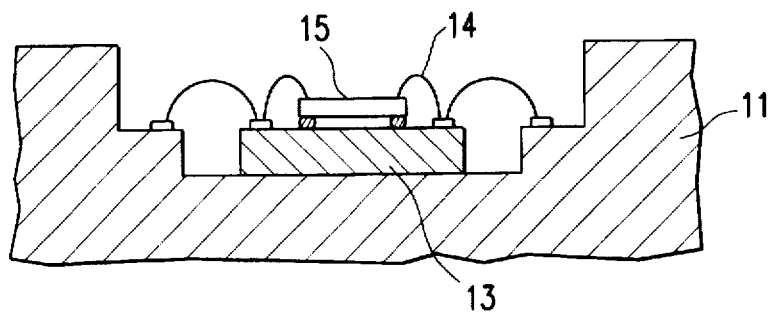
FIG. 4 is a vertical sectional view illustrating a conventional semiconductor device.

Then, as shown in FIG. 3, alloy balls 3A composed of solder and gold are disposed on the upper surface of the semiconductor element 2, and the decoupling capacitor 3 is disposed thereon followed by the heating at a temperature of 150° to 350° C. (flip-chip) to obtain the semiconductor device as shown in FIG. 1.

In this semiconductor device in which the lower surface of the decoupling capacitor 3 is electrically joined to the upper surface of the semiconductor element 2, the current path can be shortened compared with that of the conventional semiconductor devices in which the decoupling capacitor 3 and the semiconductor element 2 are connected together by wire bonding. Therefore, the inductance is suppressed to a small value making it possible to reduce the noise such as of switching that is a problem in the high-speed operation elements.

Moreover, since the decoupling capacitor 3 is prepared by using the silicon substrate 4 which is of the same material as the semiconductor element 2 composed of silicon, the coefficient of thermal expansion becomes nearly the same between the semiconductor element 2 and the decoupling capacitor 3. Therefore, thermal stress does not almost build up between the semiconductor element 2 and the decoupling capacitor 3 even when the decoupling capacitor 3 is joined to the upper surface of the semiconductor element 2 at a high temperature, and the decoupling capacitor 3 does not peel off the semiconductor element 2. The semiconductor device of high performance can be cheaply fabricated owing to the use of the cheap silicon substrate 4, thin dielectric film 6 composed of $SiO_2$, and thin electrode films 5 and 7 composed of Al, Cr or Cu.

The above-mentioned embodiment has employed the silicon substrate 4 as a substrate for supporting thin electrode films 5, 7 and thin dielectric film 6. However, the effects nearly the same as those of the above-mentioned embodiment can be obtained even by using, as the substrate, $Si_3N_4$ or SiC having a coefficient of thermal expansion close to the coefficient of thermal expansion of the semiconductor element 2 composed of silicon or, concretely, having a coefficient of thermal expansion of within ±0.8×10⁻⁶/°C. with respect to the coefficient of thermal expansion of silicon.

Furthermore, in the foregoing was described an embodiment where the thin $SiO_2$ film was used as the thin dielectric film 6 for the decoupling capacitor 3. In the present invention, however, $SrTiO_3$ may be used as the thin dielectric film. The thin dielectric film of $SrTiO_3$ has a dielectric constant (εr) of 200 and is capable of possessing a capacitance of 400 nF if it has a thickness of 0.01 μm, which is large enough as the decoupling capacitor. The effects nearly the same as those of the above-mentioned embodiment can be obtained even when other thin dielectric film is used such as of $BaTiO_3$, $Ba_{1-x}Sr_xTiO_3$, $PZT(PbZr_{1-x}Ti_xO_3)$, PLZT $(Pb_{1-x}La_xZr_{1-y}Ti_yO_3)$ or the like.

The above embodiment has dealt with the case where the semiconductor element 2 composed of silicon was used and the silicon substrate of the decoupling capacitor having the same coefficient of expansion as that of silicon was prepared. In the case of the semiconductor element composed of GaAs, for instance, the effects nearly the same as those of the above-mentioned embodiment can be obtained even when the substrate is made of a material having a coefficient of thermal expansion close to that of the semiconductor element or, concretely, having a coefficient of thermal expansion of within ±0.8×10⁻⁶/°C. with respect to the coefficient of thermal expansion of GaAs.

Moreover, an adhesive layer composed of at least one of Ni, Cr or Ti may be interposed between the silicon substrate 4 and the first thin electrode film 5.

The above embodiment has dealt with the case where the second thin electrode film 7 of the decoupling capacitor 3 and the semiconductor element 2 were joined together by an alloy of solder and gold. In the present invention, however, the silicon substrate may be arranged on the side of the semiconductor element to join the semiconductor element and the silicon substrate together. In this case, to accomplish electric conduction between the semiconductor element and the thin electrode films, through holes must be formed in the silicon substrate so that the semiconductor element and the thin electrode films are electrically connected together, or an electric conductor must be disposed at an end portion of the decoupling capacitor so that the electric conductor and the semiconductor element are electrically connected together.

In the present invention, it is preferred that the substrate have a thickness of from 0.05 mm to 3.0 mm, particularly, from 0.1 mm to 1.5 mm, and the thin film of the capacitor laminate have a thickness of from 10 angstroms to 5,000 angstroms, particularly, from 100 angstroms to 3,000 angstroms, though it may vary depending upon the capacitance that is required.

In the present invention, thick film may be employed as electrode films and dielectric film depending on case, though the embodiments in the present invention are mentioned only for thin film.

According to another embodiment of the present invention, the decoupling capacitor is constituted by a dielectric ceramic and internal electrodes that are opposed to each other via a layer of the dielectric ceramic, wherein the dielectric ceramic is composed of a material having a coefficient of thermal expansion which is close to the coefficient of thermal expansion of the semiconductor element.

It was found that when the dielectric ceramic is composed of a perovskite-type compound containing Pb, Ba, Mg, Nb, Zn, Sm and Ti which are establishing a predetermined composition, a high dielectric constant is exhibited, and the coefficient of thermal expansion of the decoupling capacitor is brought close to the coefficient of thermal expansion of a single silicon crystal over a temperature range of from −65° to 150° C.

If mentioned in further detail, quite excellent results are obtained in preventing the thermal stress from building up when the dielectric ceramic is a perovskite-type compound containing at least Pb, Mg, Nb and Zn as metal elements and further containing Mn in an amount of from 0 to 0.6% by weight reckoned as $MnO_2$ with respect to the main components in which when the composition formula of these metal elements based upon a molar ratio is expressed as,

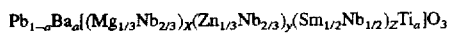

$Pb_{1-a}Ba_a[(Mg_{1/3}Nb_{2/3})_x(Zn_{1/3}Nb_{2/3})_y(Sm_{1/2}Nb_{1/2})_zTi_a]O_3$ x, y, z and a satisfy the following relations
0.3≦x≦0.815, 0.159≦y≦0.70,
0≦z≦0.040, 0≦a≦0.116, and x+y+z+a=1.00.

In the dielectric ceramic composition of the present invention, x which represents the amount of $Mg_{1/3}Nb_{2/3}$ is selected at a molar ratio to be 0.3≦x≦0.815. This is because when x is smaller than 0.3, the insulating resistance decreases and when x is greater than 0.815, the coefficient of thermal expansion changes greatly depending upon the temperature. That is, the coefficient of thermal expansion of the decoupling capacitor varies greatly from the coefficient of thermal expansion of silicon on the low-temperature side and on the high-temperature side, permitting thermal stress to build up in the decoupling capacitor which is then peeled off.

Next, y which represents the amount of $Zn_{1/3}Nb_{2/3}$ is selected to be 0.159≦y≦0.70. This is because when y is smaller than 0.159, the coefficient of thermal expansion greatly changes depending upon the temperature.

Then, z which represents the amount of $Sm_{1/2}Nb_{1/2}$ is selected to be 0≦z≦0.040. This is because when z is larger than 0.040, the sintering becomes defective if the firing temperature is not higher than 1000° C. Even if sintered, the insulation resisitance and dielectric constant decrease. The coefficient of thermal expansion increases with an increase in z which represents the amount of $Sm_{1/2}Nb_{1/2}$.

The amount a of substituting Pb with Ba is selected to be 0≦a≦0.116. This is because when a is larger than 0.116, the sintering becomes defective if the firing temperature is not higher than 1000° C.

Furthermore, Mn is added in an amount of from 0 to 0.6% by weight reckoned as $MnO_2$. This is because when the amount of Mn is larger than 0.6% by weight reckoned as $MnO_2$, the dielectric constant decreases.

It is further desired that Mn is added in an amount of from 0.1 to 0.6% by weight reckoned as $MnO_2$ with respect to the main components in which when the composition of the dielectric ceramic of the capacitor based upon the molar ratio is expressed as,

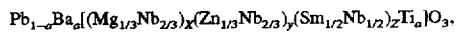

$Pb_{1-a}Ba_a[(Mg_{1/3}Nb_{2/3})_x(Zn_{1/3}Nb_{2/3})_y(Sm_{1/2}Nb_{1/2})_zTi_a]O_3$, x, y, z and a satisfy the following relations
0.52≦x≦0.70, 0.30≦y≦0.48,
0≦z≦0.04, 0≦a≦0.092, and x+y+z+a=1.00.

In this case, silver having a small resistivity can be used as an electrode making it possible to improve equivalent series resistance (ESR) as compared with when use is made of an internal electrode composed of Ag and Pd.

When the amount x of $Mg_{1/3}Nb_{2/3}$ is smaller than 0.52 or is larger than 0.70, the firing temperature exceeds 930° C. and approaches the melting point of Ag (962° C.) that is used as the electrode making it difficult to stably carry out the firing. When the amount y of $Zn_{1/3}Nb_{2/3}$ is smaller than 0.30 or is larger than 0.48, the firing temperature exceeds 930° C. and approaches the melting point of Ag (962° C.) that is used as the electrode making it difficult to stably carry out the firing.

When the amount a of substituting Pb with Ba becomes larger than 0.092, the firing temperature exceeds 930° C. and approaches the melting point of Ag making it difficult to stably carry out the firing.

To obtain the dielectric ceramic in the semiconductor device of the present invention, PbO, $MgNb_2O_6$, ZnO, $Nb_2O_5$, $BaCO_3$, $TiO_2$, $Sm_2O_3$ and $MnO_2$ are used as starting powders and are weighed by predetermined amounts, or compounds such as carbonates, nitrates and sulfates that can be transformed into these oxides are weighed by predetermined amounts, and, after a solvent is added thereto, are mixed by using a ball mill for 20 to 48 hours. The mixture is then dried, calcined for 2 to 4 hours at 850° to 950° C., mixed and pulverized for 20 to 48 hours, and are dried. Then, a predetermined amount of binder is added, the mixture is granulated by spray drying, and the obtained powder is molded. Thereafter, the molded article is treated at 300° to 450° C. for 4 hours to remove the binder and is then fired in the open air at a temperature of 920° to 1120° C. for 1 to 2 hours to obtain the dielectric ceramic as contemplated by the present invention.

To form the decoupling capacitor, the slurry obtained by mixing and pulverizing the starting powders is formed into a sheet by using a doctor blade, an electrode paste composed of Ag or Ag and Pd is applied to both sides of the dielectric sheet followed by drying. Then, a dielectric sheet to which the electrode paste has not been applied is laminated on both sides of the dielectric sheet to which the electrode paste has been applied. The sheets are then adhered together with pressure and are fired. The semiconductor device of the present invention is obtained by joining the thus obtained decoupling capacitor to the upper surface of the semiconductor element of the insulating ceramic.

Figure 5:
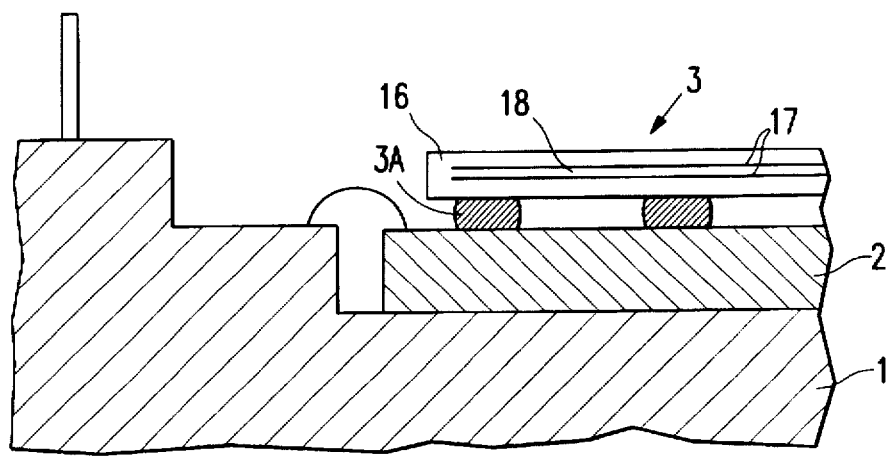
FIG. 5 is a sectional view which schematically illustrates another arrangement in the semiconductor device of the present invention.

In the semiconductor device of the embodiment of the present invention as shown in FIG. 5, the decoupling capacitor 3 is constituted by a particular dielectric ceramic 16, and internal electrodes 17 and 17 that are opposing to each other via a dielectric ceramic layer 18, and the internal electrodes 17 and 17 are electrically connected to the semiconductor element 2 via solder 3A.

The dielectric ceramic in the semiconductor device of the embodiment of the invention will now be described in detail by way of the embodiment.

Powders of PbO, $MgNb_2O_6$, ZnO, $Nb_2O_5$, $BaCO_3$, $TiO_2$, $Sm_2O_3$ and $MnO_2$ are weighed as starting material powders as shown in Table 1 followed by the addition of a solvent, and are mixed and pulverized for 20 hours using $ZrO_2$ balls. After drying, the mixture is calcined at 850° C. for 4 hours, and is mixed and pulverized for 20 hours using $ZrO_2$ balls followed by drying.

TABLE 1

| Sample No. | Composition (molar ratio) | | | | $MnO_2$ (wt %) | Firing temperature (°C.) |
|---|---|---|---|---|---|---|
| | x | y | z | a | | |
| 1 | 0.420 | 0.523 | 0 | 0.057 | 0.125 | 960 |
| 2 | 0.420 | 0.493 | 0 | 0.087 | 0.125 | 960 |
| 3 | 0.420 | 0.464 | 0 | 0.116 | 0.125 | 960 |
| 4 | 0.300 | 0.613 | 0.020 | 0.067 | 0.125 | 960 |
| 5 | 0.420 | 0.504 | 0.020 | 0.056 | 0.125 | 960 |
| 6 | 0.520 | 0.407 | 0.020 | 0.053 | 0.125 | 930 |
| 7 | 0.520 | 0.368 | 0.020 | 0.092 | 0.125 | 930 |
| 8 | 0.600 | 0.342 | 0.020 | 0.038 | 0.125 | 920 |
| 9 | 0.600 | 0.323 | 0.020 | 0.057 | 0.125 | 920 |
| 10 | 0.600 | 0.304 | 0.020 | 0.076 | 0.125 | 920 |
| 11 | 0.680 | 0.270 | 0.020 | 0.030 | 0.125 | 930 |
| 12 | 0.700 | 0.234 | 0.040 | 0.026 | 0.125 | 930 |
| *13 | 0.250 | 0.657 | 0.020 | 0.073 | 0.125 | 960 |
| *14 | 0.850 | 0.117 | 0.020 | 0.013 | 0.125 | 980 |
| 15 | 0.815 | 0.159 | 0.010 | 0.016 | 0.125 | 980 |
| 16 | 0.300 | 0.700 | 0 | 0 | 0.500 | 980 |
| *17 | 0.420 | 0.441 | 0.090 | 0.049 | 0.125 | 920 |
| *18 | 0.420 | 0.430 | 0.030 | 0.120 | 0.125 | 930 |
| *19 | 0.600 | 0.342 | 0.020 | 0.038 | 0.700 | 930 |
| 20 | 0.600 | 0.342 | 0.020 | 0.038 | 0.600 | 930 |
| 21 | 0.600 | 0.342 | 0.020 | 0.038 | 0 | 980 |

Samples marked with * lie outside the scope of the Invention.

Then, PVA is added in an amount of 1% by weight thereto. The mixture is granulated by spray drying and is then press-molded into a disk (12 mm in diameter and 1 mm in thickness) for measuring electric properties and into a rectangular parallelopiped (6 mm long, 4 mm wide and 40 mm high) for measuring thermal expansion under the application of a pressure of 1 ton/cm$^2$. Thereafter, the molded articles are treated at 450° C. for 4 hours to remove the binder and are fired in the open air at temperatures as shown in Table 1 for 2 hours.

The obtained sintered products for measuring thermal expansion were measured for their coefficients of thermal expansion over a temperature range of from −65° to 150° C. by using a thermal expansion analyzer (TMA) while raising the temperature of the sintered products at a rate of 5° C./min.

Electrodes composed of In and Ga were formed on both sides of the sintered products for measuring electric properties and were measured for their capacitance and dielectric loss (tan δ) at a frequency of 1 kHz and a voltage of 1 Vrms. The insulation resistance was measured by applying a voltage of 250 V or one minute. The dielectric constant was found by calculation from the capacitance.

The results were as shown in Table 2. The coefficients of thermal expansion are those of measured at −22° C., 21° C., 64° C., 107° C. and 150° C. with the one measured at −65° C. as a reference length.

The sample No. 22 of Table 2 represents the coefficient of thermal expansion of a dielectric ceramic composed chiefly of BaTiO3 that is used in the conventional decoupling capacitors, and the sample No. 23 represents the coefficient of thermal expansion of a silicon semiconductor.

TABLE 2

| Sample No. | Coefficient of thermal expansion ($10^{-6}$/°C.) | | | | Dielectric const. ($\epsilon r$) | Dielectric loss (%) | Insulating resistance IR cm × $10^{12}$ |
|---|---|---|---|---|---|---|---|
| | −22 | 21 | 64 | 107 | 150 | | | |
| 1 | 2.2 | 2.1 | 2.1 | 2.2 | 2.5 | 6990 | 0.14 | 3.4 |
| 2 | 2.4 | 2.4 | 2.3 | 2.4 | 2.7 | 9390 | 0.47 | 6.7 |
| 3 | 2.7 | 2.6 | 2.7 | 2.9 | 3.2 | 7780 | 0.24 | 4.0 |
| 4 | 2.8 | 2.8 | 2.7 | 2.7 | 2.9 | 5720 | 0.10 | 6.4 |
| 5 | 2.6 | 2.6 | 2.5 | 2.7 | 3.0 | 6100 | 0.10 | 5.7 |
| 6 | 2.3 | 2.3 | 2.2 | 2.4 | 2.8 | 6000 | 0.20 | 4.0 |
| 7 | 2.6 | 2.6 | 2.5 | 2.7 | 3.0 | 3830 | 0.20 | 4.0 |
| 8 | 2.1 | 1.9 | 1.9 | 2.1 | 2.6 | 5920 | 0.33 | 3.7 |
| 9 | 2.2 | 2.2 | 2.3 | 2.5 | 3.0 | 5400 | 0.22 | 18.0 |
| 10 | 2.2 | 2.2 | 2.3 | 2.5 | 2.8 | 4930 | 0.19 | 26.0 |
| 11 | 2.0 | 1.8 | 1.9 | 2.1 | 2.6 | 5500 | 0.20 | 4.0 |
| 12 | 2.7 | 2.8 | 2.8 | 2.9 | 3.0 | 4000 | 0.13 | 3.0 |
| *13 | 2.9 | 2.9 | 2.8 | 2.7 | 2.9 | 5500 | 0.10 | 0.1 |
| *14 | 1.5 | 1.6 | 1.7 | 2.1 | 2.8 | 5000 | 0.04 | 6.0 |
| 15 | 1.9 | 1.9 | 2.0 | 2.2 | 2.6 | 5100 | 0.04 | 5.5 |
| 16 | 1.9 | 1.9 | 2.0 | 2.2 | 2.6 | 8000 | 0.40 | 5.0 |
| *17 | 4.0 | 3.7 | 4.0 | 4.3 | 4.7 | 2800 | 0.15 | 0.09 |
| *18 | 3.0 | 2.9 | 3.0 | 3.1 | 3.7 | poorly sintered | | |
| *19 | 2.2 | 2.0 | 2.0 | 2.3 | 2.7 | 2400 | 0.30 | 3.0 |
| 20 | 2.2 | 2.0 | 2.0 | 2.3 | 2.7 | 3800 | 0.30 | 5.0 |
| 21 | 1.9 | 1.8 | 1.9 | 2.0 | 2.4 | 8500 | 0.20 | 5.0 |
| *22 | 5.7 | 5.6 | 6.0 | 6.7 | 7.3 | | | |
| 23 | 2.1 | 2.3 | 2.5 | 2.6 | 2.7 | | | |

Samples marked with * lie outside the scope of the invention.

It will be understood from these Tables 1 and 2, that the dielectric ceramics of the present invention exhibit coefficients of thermal expansion that lie within a range of ±0.7×$10^{-6}$/°C. with respect to the coefficient of thermal expansion of silicon over a temperature range of from −65° C. to 150° C. It will be further understood that the dielectric constant is as great as 3000 or more and the insulation resistance is as large as 3×$10^{12}$ Ωcm or higher. Since the dielectric constant is as large as 3000 or higher, a sufficiently large capacitance is obtained even with a single layer.

According to the present invention in which the lower surface of the decoupling capacitor is joined to the upper surface of the semiconductor element as described above in detail, the current path is so short that the inductance can be decreased and switching noise can be reduced, enabling the data to be processed at high speeds. Moreover, since the coefficient of thermal expansion of the decoupling capacitor is nearly equal to the coefficient of thermal expansion of the semiconductor element, the decoupling capacitor is reliably prevented from peeling off the semiconductor element even when the device is heated at a high temperature at the time of joining the decoupling capacitor to the semiconductor element.

Moreover, since the dielectric ceramic of the decoupling capacitor is composed of a perovskite-type compound containing Pb, Ba, Mg, Nb, Zn, Sm and Ti which are establishing a predetermined composition, a high dielectric constant is exhibited. Besides, the coefficient of thermal expansion of the decoupling capacitor can be brought close to the coefficient of thermal expansion of a single silicon crystal over a temperature range of from −65° C. to 150° C.

We claim:

1. A semiconductor device, comprising:
   an insulating substrate having an exterior surface,
   a silicon semiconductor element having a coefficient of thermal expansion, a first exterior surface and a second exterior surface, the first exterior surface of the silicon semiconductor element being mounted on the exterior surface of the insulating substrate, and
   a decoupling capacitor joined to the second exterior surface of the silicon semiconductor element and electrically connected to the silicon semiconductor element, at least a portion of the semiconductor element being intermediate the exterior surface of the insulating substrate and the decoupling capacitor, wherein
   the decoupling capacitor is electrically connected to the silicon semiconductor element by soldering and has
   a first electrode film composed of at least one element selected from the group consisting of Al, Cr and Cu, a thin $SiO_2$ dielectric film and
   a second thin electrode film composed of at least one element selected from the group consisting of Al, Cr and Cu that are formed in this order on the surface of a substrate made of a material selected from the group consisting of silicon, $Si_3N_4$ and SiC, having a coefficient of thermal expansion over a temperature range of from −65° to 150° C. which lies within ±0.8×$10^{-6}$/°C. with respect to the coefficient of thermal expansion of the silicon semiconductor element.

2. A semiconductor device according to claim 1, wherein the substrate of the decoupling capacitor is made of a material selected from the group consisting of silicon, $Si_3N_4$ and SiC.

3. A semiconductor device according to claim 1, wherein the first thin electrode film, the thin dielectric film and the second thin electrode film of the decoupling capacitor are formed by a thin film-forming means.

4. A semiconductor device comprising an insulating substrate, a semiconductor element mounted on said insulating substrate, and a decoupling capacitor which is joined to the upper surface of said semiconductor element and is electrically connected to said semiconductor element, wherein said decoupling capacitor is constituted by a dielectric ceramic and internal electrodes, and said dielectric ceramic is a perovskite-type compound containing at least Pb, Mg, Nb and Zn as metal elements and further containing Mn in an amount of from 0 to 0.6% by weight reckoned as $MnO_2$ with respect to the main components in which when the composition formula of these metal elements based upon a molar ratio is expressed as, $$Pb_{1-a}Ba_a[(Mg_{1/3}Nb_{2/3})_x(Zn_{1/3}Nb_{2/3})_y(Sm_{1/2}Nb_{1/2})_zTi_a]O_3,$$

x, y, z and a satisfy the following relations,
0.300≦x≦0.815,
0.159≦y≦0.700,
0≦z≦0.040,
0≦a≦0.116, and
x+y+z+a=1.00.

* * * * *